United States Patent [19]

Toyoshima et al.

[11] Patent Number: 5,173,359

[45] Date of Patent: Dec. 22, 1992

[54] COMPOSITE MATERIAL FOR ELECTRICAL APPLICATIONS REINFORCED BY PARA-ORIENTED ARAMIDE FIBROUS SUBSTANCE AND PROCESS FOR PREPARING SAME

[75] Inventors: Setuo Toyoshima, Tokyo; Megumi Kimura, Kawasaki, both of Japan

[73] Assignee: Honshu Paper Co., Ltd., Japan

[21] Appl. No.: 579,079

[22] Filed: Sep. 6, 1990

[30] Foreign Application Priority Data

Sep. 8, 1989 [JP] Japan ................................. 1-233498

[51] Int. Cl.⁵ .......................................... B32B 27/34
[52] U.S. Cl. .................................... 428/229; 428/267; 428/272; 428/290; 428/286; 428/476.3
[58] Field of Search ................. 428/229, 267, 272, 290

[56] References Cited

U.S. PATENT DOCUMENTS 4,637,851  1/1987  Ueno et al. ............................ 427/40
5,002,637  3/1991  Toyoshima et al. ................. 428/447

FOREIGN PATENT DOCUMENTS 301695  9/1989  Japan .

*Primary Examiner*—George F. Lesmes
*Assistant Examiner*—Kathryne E. Shelborne
*Attorney, Agent, or Firm*—Rosenman & Colin

[57] ABSTRACT

A composite material for electrical applications reinforced by a para-oriented aramide fibrous substance made of a para-oriented aramide fibrous substance selected from the group consisting of poly(p-phenylene terephthalamide) fiber and poly(p-phenylene-3,4'-diphenyl ether terephthalamide) fiber, a thermosetting resin matrix and a polymer having at least one specific reactive cross-linking group selected from the group consisting of carboxyl group, epoxy group, hydroxyl group and methylol group. The polymer resides at the interface between the para-oriented aramide fibers and the thermosetting resin matrix. The composite material for electrical applications can be prepared according to a method having the steps of treating a para-oriented aramide fibrous substance selected from the group consisting of poly(p-phenylene terephthalamide) fiber and poly(p-phenylene-3,4'-diphenyl ether terephthalamide) fiber with an emulsion containing a polymer carrying at least one reactive cross-linking group selected from the group consisting of carboxyl, epoxy, hydroxyl and methylol groups and a particle size ranging from 0.01 to 0.08 $\mu$, drying the treated fibrous substance and then laminating the fibrous substance with a thermosetting resin matrix. The composite material shows excellent properties well suited for use, in particular, as a composite material for electrical applications or a reinforcing substrate such as a printed circuit board or an insulating laminate.

10 Claims, No Drawings

COMPOSITE MATERIAL FOR ELECTRICAL APPLICATIONS REINFORCED BY PARA-ORIENTED ARAMIDE FIBROUS SUBSTANCE AND PROCESS FOR PREPARING SAME

BACKGROUND OF THE INVENTION

1. Field of the Invention

The present invention relates to a composite material for electrical applications reinforced by a para-oriented aramide fiber sheet and a process for preparing the same. More particularly, it relates to a composite material for electrical applications reinforced by a para-oriented aramide fiber sheet, which shows excellent properties well suited for use, in particular, as a reinforcing substrate such as a printed circuit board or an insulating laminate.

2. Description of the Related Art

Para-oriented aramide fibers have a variety of improved physical properties, for instance, they have excellent resistance to heat, resistance to fatigue and resistance to chemicals and they have high strength and a high modulus of elasticity. However, since they have poor adhesiveness to thermosetting resins and cannot thus be intimately bonded to thermosetting resins using conventional technology, their excellent properties are not thoroughly utilized as substrates for composite materials.

In order to solve this problem, there have been proposed a variety of improved aramide fibers such as those exposed to plasma (see, for instance, Unexamined Japanese Patent Publication Nos. 125689/1984 and 171738/1986); those treated with an aminopolyamide resin as disclosed in Unexamined Japanese Patent Publication No. 204229/1986; those treated with a polyurethane compound as disclosed in Japanese Patent Publication No. 14166/1986; and those treated with a resorcin-formalin oligomer as disclosed in Unexamined Japanese Patent Publication No. 121591/1975. Although it is stated, in these patents, that the aramide fibers treated through these prior art techniques have improved adhesiveness compared with that for untreated ones, the results obtained by these methods are not yet satisfactory.

In particular, a laminate for electrical applications should have high electric resistance even after it has absorbed water. However, a composite material for electrical applications reinforced by para-oriented aramide fibers and having satisfactory electric resistance after having immersed into a boiled water has not yet been developed or proposed.

It is known that a laminate can be prepared by first impregnating a para-oriented aramide fiber sheet with a thermosetting resin such as an epoxy resin or a polyimide to form a prepreg which is then stacked and subjected to hot-press molding, and that the laminate prepared according such a method is low in thermal expansion coefficient and improved in dimensional stability due to the excellent properties of the para-oriented aramide fibers (see Unexamined Japanese Patent Publication No. 160500/1986).

However, the para-oriented aramide fibers in the resultant laminate do not adhere sufficiently to the thermosetting resin, which results in unsatisfactory electric resistance after the laminate has absorbed a boiled water. Accordingly, the laminate prepared using conventional technology cannot be practically applied.

SUMMARY OF THE INVENTION

It is a primary object of the present invention to overcome or solve the aforementioned problems associated with the known composite materials reinforced by para-oriented aramide fibers.

A more specific object of the present invention is to provide a composite material reinforced by para-oriented aramide fibers, which may be applied in electrical uses, for instance, in the form of a laminate.

In this connection, the present applicant already filed a patent application which relates to a composite material reinforced by a para-oriented aramide fiber sheet which comprises a para-oriented aramide fiber sheet, a thermosetting resin matrix and a reactive siloxane oligomer existing at the interface between the fibers of the para-oriented aramide fiber sheet and the thermosetting resin matrix (Unexamined Japanese Patent Publication No. 141925/1989: corresponding to U.S. Ser. No. 276,765, now U.S. Pat. No. 5,002,637).

More specifically, the present invention has been completed based on the results of the further advancement of the studies and development of the technique disclosed in the above application.

According to an embodiment of the present invention, there is provided a composite material for electrical applications reinforced by a para-oriented aramide fibrous substance which comprises a para-oriented aramide fibrous substance, a thermosetting resin matrix and a polymer having specific reactive cross-linking groups, e.g., carboxyl groups, epoxy groups, hydroxyl group and/or methylol groups, excluding reactive siloxane oligomers. The polymer resides at the interface between the fibers of the para-oriented aramide fibrous substance and the thermosetting resin matrix.

According to another embodiment of the present invention, there is provided a method for preparing a composite material for electrical applications reinforced by a para-oriented aramide fibrous substance which comprises the steps of treating a para-oriented aramide fibrous substance selected from the group consisting of poly(p-phenylene terephthalamide) fiber and poly(p-phenylene-3,4'-diphenyl ether terephthalamide) fiber with an emulsion containing a polymer which has at least one reactive cross-linking group selected from the group consisting of carboxyl, epoxy, hydroxyl and methylol groups and a particle size ranging from 0.01 to 0.08 $\mu$, drying the treated fibrous substance and then laminating the fibrous substance with a thermosetting resin matrix.

According to a further embodiment of the present invention, there is provided a method for preparing a composite material for electrical applications reinforced by a para-oriented aramide fibrous substance wherein the para-oriented aramide fibers are immersed in an acidic aqueous solution having a pH of not more than 5, before or after the fibers are formed into a sheet.

Further objects, features and advantages of the present invention will become apparent from the Detailed Discription of the Preferred Embodiments when considered together with the illustrative examples.

DETAILED DISCRIPTION OF THE PREFERRED EMBODIMENTS

The present invention will hereinafter be described in more detail with reference to several preferred embodiments.

In the present invention, para-oriented aramide fibers are used as the fibrous substance. Specific examples of the para-oriented aramide fibers used in the invention are fibers of poly(p-phenylene terephthalamide) represented by the following chemical formula:

—(NH-p-Ph-NHOC-p-Ph-CO)$_r$— or fibers of poly(p-phenylene-3,4'-diphenyl ether terephthalamide) represented by the following chemical formula:

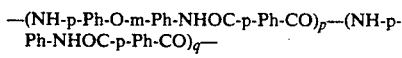

—(NH-p-Ph-O-m-Ph-NHOC-p-Ph-CO)$_p$—(NH-p-Ph-NHOC-p-Ph-CO)$_q$—

(in the foregoing formulae, p-Ph means a p-phenylene group and m-Ph a m-phenylene group). These fibers are usually used in the form of a monofilament having a diameter ranging from about 5 to 20 Ξm or in the form of a branched fibril prepared by a microfibril-forming process.

Other materials such as known synthetic fibers and/or inorganic fibers may optionally be added to the para-oriented aramide fibers, if necessary.

The foregoing fibrous substances used in the present invention are in general used in the form of sheets.

The para-oriented aramide fiber sheets may be fabricated according to any known method. More specifically, wet and dry paper making processes can be used for the fabrication of the para-oriented aramide fiber sheets.

For instance, according to a process similar to the wet paper making process generally adopted for the preparation of a synthetic fiber sheets, the para-oriented aramide fiber sheet may be produced by cutting para-oriented aramide fibers into short fibers to thus form chopped strands, dispersing, in water, the chopped strands alone or a combination thereof with a pulp obtained by mechanically processing para-oriented aramide fibers, sufficiently homogenizing the strands or the mixed fibers and then scooping the dispersed fibers on to a wire netting to thus give a sheet.

In the present invention, the thermosetting resins used as the matrix for the composite material may be, for instance, epoxy resins or polyimide resins.

The para-oriented aramide fibers per se do not show adhesion properties. Accordingly, a binder is added to the para-oriented aramide fibers to thus bind them with each other in the present invention.

Examples of the binders usable in the present invention are thermosetting resin binders such as epoxy resins, unsaturated polyester resins, polyimide resins and phenolic resins.

As the binders practically used in the present invention, the foregoing thermosetting resin binders may be used alone or incombination with a polymer having reactive cross-linking groups as will be explained below. The amount of such a binder generally ranges from about 3 to 30% by weight based on the total weight of the para-oriented aramide fibers employed.

Accordingly, the para-oriented aramide fiber sheets used in the present invention may be woven fabrics comprising the para-oriented aramide fibers. The fiber sheets may also be non-woven fabrics obtained by treating the para-oriented aramide fibers or a fibrous material mainly comprising the para-oriented aramide fibers with a thermosetting binder or an admixture of the thermosetting binder with an emulsion containing a polymer carrying reactive cross-linking groups to bind the fibers or the fibrous material with each other.

The para-oriented aramide fiber sheets thus obtained, which may be in the wet or dry state, are treated with an emulsion containing a polymer carrying reactive cross-linking groups and then dried. Any known means, including impregnation by dipping or spraying may be adopted for treating the para-oriented aramide fiber sheet. In this respect, the particle size of the polymer dispersed in the emulsion preferably ranges from 0.01 to 0.08 μm.

The reactive cross-linking group of the polymer may be at least one member selected from the group consisting of methylol group, hydroxyl group, carboxyl group and epoxy group. Thus, the emulsion whose surface is modified by these reactive cross-linking groups may be used in the invention.

In addition, the resin as a principal component of the emulsion may be any known ones and, in particular, acrylic resins are preferably used.

The amount of the polymer carrying cross-linking groups is desirably not more than about 2% by weight based on the weight of the para-oriented aramide fibers used.

According to another feature of the present invention, the para-oriented aramide fibers are dipped in an acidic aqueous solution having a pH of not more than 5, before or after they are formed into a woven or non-woven fabric, then neutralized and washed with water.

The fibrous substance which has been treated with the emulsion containing the polymer carrying reactive cross-linking groups is then dried. The drying operation is preferably performed by blowing hot air maintained at a temperature ranging from 100° to 150° C. through the fibrous substance.

The resulting sheet-like material of the para-oriented aramide fibers may be directly used as a substrate or a reinforcing material for a laminate without any further treatment.

The sheet material may optionally be passed through calender rolls maintained at about 120° to 200° C. at a high speed to increase the density of the sheet material to a desired level.

According to the present invention, the sheet material of the para-oriented aramide fibers may also be used as a reinforcing substrate material which is combined with a thermosetting resin matrix to form a composite material for electrical applications.

The composite material of the present invention may be prepared any of a number of known processes, but it is preferred that the resin or a mixture thereof for the matrix be impregnated into the sheet material in the form of a so-called "varnish" obtained by dissolving the resin or the mixture thereof in a variety of solvents.

In the conventional technology, various coupling agents such as silane base or titanium base agents have generally been used in order to enhance the adhesion between the reinforcing substrate material and the resin matrix, but it is found that these known coupling agents are not effective at all in enhancing the adhesion between the para-oriented aramide fibers and a resinous material.

The invention will now be discribed in terms of the following non-limiting working Examples and the results practically attained by the present invention will also be discussed in detail in comparison with the following Comparative Examples.

EXAMPLE 1

Kevlar 49 and Kevlar pulp (both available from E. I. Du Pont de Nemours & Co., Inc.) were mixed in a mixing ratio of 3:1 and used as the para-oriented aramide fiber material. The mixture of Kevlar 49 and Kevlar pulp was dispersed in water to prepare a paper making dispertion having a final fiber concentration of 0.5%. Then a paper-like sheet having a basis weight of 50 g/m$^2$ was made from the paper making dispersion, a cylinder paper machine. An epoxy resin emulsion was applied to the non-woven sheet thus prepared by spraying it onto the sheet so that the amount of the emulsion applied was equal to about 10% by weight expressed in the reduced amount of the solid contents. The sheet was then dried by passing it through a hot air zone maintained at 120° C. to thus obtain a dried continuous sheet. Then the sheet was immersed in a 2% aqueous solution containing an acrylic polymer carrying methylol groups (a processing agent available from Hoechst Chemical Co., Ltd. under the trade name of LA-544M2) and dried by subjecting it to hot-air drying at 120° C. The sheet thus treated was calendered and then subjected to a heat treatment at 180° C. for one minute. As a result, a para-oriented aramide fiber sheet having a density of 0.5 g/cm$^3$ was obtained.

The para-oriented aramide fiber sheet was impregnated with an epoxy resin varnish having the composition as set forth below and dried for 5 minutes in an atmosphere maintained at 140° C. to form a prepreg.

| Composition of Epoxy Resin Varnish | |
|---|---|
| Epikote 1001-B-80 (available from Shell International Chemicals, Corp.) | 50 parts |
| Methyl Ethyl Ketone | 32 parts |
| Dicyandiamide | 1.6 parts |
| Methyl Cellosolve | 16 parts |
| Benzyldimethylamine | 0.08 parts |

Twenty sheets of the prepreg were stacked, with both the top and bottom faces of the stack covered by a 35 micron thick copper foil for a printed circuit board and heated under pressure at 180° C. for 2 hours while applying a pressure of 50 kg/cm$^2$ in a hot press, whereby a laminate was obtained. The electrical properties of the laminate thus prepared were appraised generally in accordance with the JIS C-6481 method. The results obtained are listed in Table I. As seen from the results listed in Table I, the resulting laminate had satisfactory properties for electrical applications.

EXAMPLE 2

The same fibrous ingredients and binders as those used in Example 1 were employed and the same paper making process was repeated to form a non-woven sheet. The non-woven sheet thus obtained was immersed in deionized water whose pH was controlled to 4 by the addition of sulfuric acid, heated to 40° C., maintained at 40° C. for 30 minutes, washed with deionized water, then neutralized with an aqueous solution of magnesium hydroxide and further washed with deionized water. The sheet which had been washed sufficiently and dried was treated using the same processing agent (a polymer carrying methylol groups) and the conditions as those used in Example 1. Using the para-oriented aramide fiber sheet thus obtained, a laminate was produced in the same manner as in Example 1 and the electrical properties of the resulting laminate was likewise evaluated in the same manner as in Example 1. The results observed are summarized in Table I.

EXAMPLE 3

A plain weave aramide fiber cloth having a basis weight of 173 g/m$^2$ and a thickness of 0.25 mm was used as a para-oriented aramide fiber sheet which was treated with an acrylic polymer carrying carboxyl groups (a processing agent available from Hoechst Chemical Co., Ltd. under the trade name of LA-544C3) in a manner similar to that used in Example 1. The sheet thus treated was then impregnated with the same epoxy resin varnish as used in Example 1 in a manner similar to that described in Example 1 to form a prepreg. Six sheets of the resuting prepreg were stacked and then molded under the same conditions as described in Example 1 to prepare a laminate. The electrical properties of the resulting laminate were appraised as in Example 1. The results obtained are summarized in Table I given below.

COMPARATIVE EXAMPLE 1

The same procedures used in Example 1 were repeated except that the para-oriented aramide fiber sheet was not treated with a processing agent to thus obtain a laminate. The electrical properties of the laminate were likewise evaluated. The results observed are listed in the following Table I.

COMPARATIVE EXAMPLE 2

The same procedures used in Example 2 were repeated except that the para-oriented aramide fiber sheet was not treated with a processing agent (the non-woven fabric was washed with an acid) to thus obtain a laminate. The electrical properties of the product were evaluated in the same manner as in Example 1. The results observed are listed in the following Table I.

COMPARATIVE EXAMPLE 3 (U.S. Ser. No. 276,765)

A similar procedures as in Example 1 were repeated to obtain a laminate except that the para-oriented aramide fiber sheet was impregnated with a siloxane oligomer. The electrical properties of the resulting laminate were evaluated as in Example 1. The results obtained are listed in Table I.

EXAMPLE 4

The same paper making process used in Example 1 was repeated using the same fibrous ingredients and binder to form a non-woven sheet. The sheet thus obtained was impregnated with a 1% aqueous solution of an acrylic polymer carrying epoxy groups (a processing agent vailable from Hoechst Chemical Co., Ltd. under the trade name of LA-544E3) and then hot air-dried at 120° C. A laminate was produced from the sheet which had been calendered under the same conditions used in Example 1 in the same manner as used in Example 1. The electrical properties of the resulting laminate were appraised as in Example 1. The results obtained are summarized in Table I given below.

EXAMPLE 5

The same procedures used in Example 4 were repeated except that an acrylic polymer carrying hydroxyl groups (available from Hoechst Chemical Co., Ltd. under the trade name of LA-544H2) was used as a processing agent to thus produce the sheets and hence also the laminate. The electrical properties of the resulting laminate were appraised as in Example 1. The results obtained are summarized in Table I given below.

COMPARATIVE EXAMPLE 4

The same procedures used in Example 1 were repeated except that an emulsion containing a polyacrylate having a particle size ranging from 0.1 to 0.3 $\mu$m (available from Kanebo NSC Co., Ltd. under the trade name of YODOSOL 2C-625) was used as a processing agent to thus produce a sheet and hence a laminate. The electrical properties of the resulting laminate were appraised as in Example 1. The results obtained are summarized in Table I given below.

|  | Insulation Resistance (ohms)[1] | | Surface Resistance (ohm)[2] | | Thermal Resistance to Soldering at 260° C. (sec)[3] |
|---|---|---|---|---|---|
|  | Normal Cond. | After Boiling | Normal Cond. | After Being kept in Special Condition[4] |  |
| Ex. No. | | | | | |
| 1 | $2 \times 10^{15}$ | $4 \times 10^{14}$ | $3 \times 10^{14}$ | $5 \times 10^{13}$ | $\geq 180$ |
| 2 | $2 \times 10^{15}$ | $8 \times 10^{14}$ | $5 \times 10^{14}$ | $8 \times 10^{13}$ | $\geq 180$ |
| 3 | $2 \times 10^{15}$ | $5 \times 10^{14}$ | $3 \times 10^{14}$ | $6 \times 10^{13}$ | $\geq 180$ |
| 4 | $3 \times 10^{15}$ | $4 \times 10^{14}$ | $3 \times 10^{14}$ | $6 \times 10^{13}$ | $\geq 180$ |
| 5 | $2 \times 10^{15}$ | $4 \times 10^{14}$ | $4 \times 10^{14}$ | $5 \times 10^{13}$ | $\geq 180$ |
| Comp. Ex. | | | | | |
| 1 | $1 \times 10^{15}$ | $1 \times 10^{12}$ | $4 \times 10^{12}$ | $6 \times 10^{11}$ | 80 |
| 2 | $2 \times 10^{15}$ | $1 \times 10^{12}$ | $3 \times 10^{12}$ | $7 \times 10^{11}$ | 90 |
| 3 | $1 \times 10^{15}$ | $2 \times 10^{13}$ | $3 \times 10^{13}$ | $7 \times 10^{12}$ | $\geq 180$ |
| 4 | $2 \times 10^{15}$ | $2 \times 10^{12}$ | $5 \times 10^{12}$ | $7 \times 10^{11}$ | 110 |

[1] JIS C-6481
[2] ASTM D1867-64T, page 850.
[3] ASTM D1867-641, page 849.
[4] Humidity 90%, temperature 35° C., leaving hour 96 hrs.

What is claimed is:

1. A composite material reinforced by a para-oriented aramide fibrous substance, comprising: a para-oriented aramide fibrous substance selected from the group consisting of poly(p-phenylene terephthalamide) fiber and poly(p-phenylene-3,4'-diphenyl ether terephthalamide) fiber; a thermosetting resin matrix; and an acrylic polymer having at least one specific reactive cross-linking group selected from the group consisting of carboxyl group, epoxy group, hydroxyl group and methylol group, which the polymer resides at the interface between the para-oriented aramide fibers and the thermosetting resin matrix.

2. The composite material according to claim 1 wherein the thermosetting resin matrix is an epoxy resin matrix.

3. The composite material according to claim 1 wherein the para-oriented aramide fibrous substance is a woven fabric.

4. The composite material according to claim 1 wherein the para-oriented aramide fibrous substance is a non-woven fabric.

5. The composite material according to claim 4 wherein the non-woven fabric is one produced by binding either the para-oriented aramide fibers or a fiber mixture mainly comprising the para-oriented aramide fibers with a thermosetting resin binder or a mixture of a thermosetting resin binder and an emulsion containing said acrylic polymer.

6. The composite material according to claim 5 wherein the thermosetting resin binder is a member selected from the group consisting of epoxy resins, unsaturated polyester resins, polyimide resins, phenolic resins and mixture thereof.

7. The composite material according to claim 5 wherein the amount of the binder ranges from about 3 to 20% by weight on based on the total weight of the para-oriented aramide fiber used.

8. The composite material according to claim 1 wherein the para-oriented aramide fibers are in the form of monofilaments having a diameter ranging from about 5 to 20 $\mu$m.

9. The composite material according to claim 1, wherein the para-oriented aramide fibrous substance are in the form of branched fibrils prepared by a microfibril-forming process.

10. The composite material according to claim 1, wherein the acrylic polymer has at least one specific reactive cross-linking group selected from the group consisting of carboxyl, hydroxyl and methylol.

* * * * *